(12) United States Patent
Farkas et al.

(10) Patent No.: US 11,751,323 B2
(45) Date of Patent: Sep. 5, 2023

(54) QUAD-TRACE STRUCTURES FOR HIGH-SPEED SIGNALING

(71) Applicant: DELL PRODUCTS, LP, Round Rock, TX (US)

(72) Inventors: Sandor Farkas, Round Rock, TX (US); Bhyrav Mutnury, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/443,742

(22) Filed: Jul. 27, 2021

(65) Prior Publication Data

US 2023/0031615 A1 Feb. 2, 2023

(51) Int. Cl.
*H05K 1/02* (2006.01)
*H05K 1/18* (2006.01)
*H05K 1/11* (2006.01)
*H05K 3/46* (2006.01)

(52) U.S. Cl.
CPC ........... *H05K 1/0245* (2013.01); *H05K 1/115* (2013.01); *H05K 3/4644* (2013.01); *H05K 1/18* (2013.01); *H05K 2201/09636* (2013.01); *H05K 2201/09672* (2013.01)

(58) Field of Classification Search
CPC ...... H05K 1/0245; H05K 1/115; H05K 1/116; H05K 1/0216; H05K 1/0228; H05K 1/165; H05K 2201/09645; H05K 2201/09672; H05K 2201/09236; H05K 2201/0979; H01P 3/08–088
See application file for complete search history.

(56) References Cited

U.S. PATENT DOCUMENTS

| | | | |
|---|---|---|---|
| 9,024,196 B2 | 5/2015 | Yoneya et al. | |
| 9,433,081 B1 | 8/2016 | Xiong et al. | |
| 2008/0078571 A1* | 4/2008 | Imaoka | H05K 1/0245 174/262 |
| 2012/0243184 A1* | 9/2012 | Lee | H05K 1/0245 174/251 |
| 2017/0303391 A1* | 10/2017 | Miyasaka | H05K 1/0245 |
| 2018/0012834 A1* | 1/2018 | Wang | H01L 23/49827 |

* cited by examiner

*Primary Examiner* — Roshn K Varghese
(74) *Attorney, Agent, or Firm* — Larson Newman, LLP

(57) ABSTRACT

A printed circuit board (PCB) is provided for transmitting a differential signal. The PCB includes first and second conductive signal layers. The first conductive signal layer includes a first positive trace of the differential signal and a first negative trace of the differential signal. The second conductive signal layer includes a second positive trace of the differential signal and a second negative trace of the differential signal. The first positive trace is adjacent to the first negative trace, and the second positive trace is adjacent to the second negative trace and directly below the first negative trace.

17 Claims, 5 Drawing Sheets

100

110

115

200   205

210

300
(Prior Art)    11-Layer Insulation 310
(Quad Trace)    9-Layer Insulation

US 11,751,323 B2

QUAD-TRACE STRUCTURES FOR HIGH-SPEED SIGNALING

FIELD OF THE DISCLOSURE

This disclosure generally relates to information handling systems, and more particularly relates to quad-trace structures for high-speed signaling in an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A printed circuit board (PCB) may be provided for transmitting a differential signal. The PCB may include first and second conductive signal layers. The first conductive signal layer may include a first positive trace of the differential signal and a first negative trace of the differential signal. The second conductive signal layer may include a second positive trace of the differential signal and a second negative trace of the differential signal. The first positive trace may be adjacent to the first negative trace, and the second positive trace may be adjacent to the second negative trace and directly below the first negative trace.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
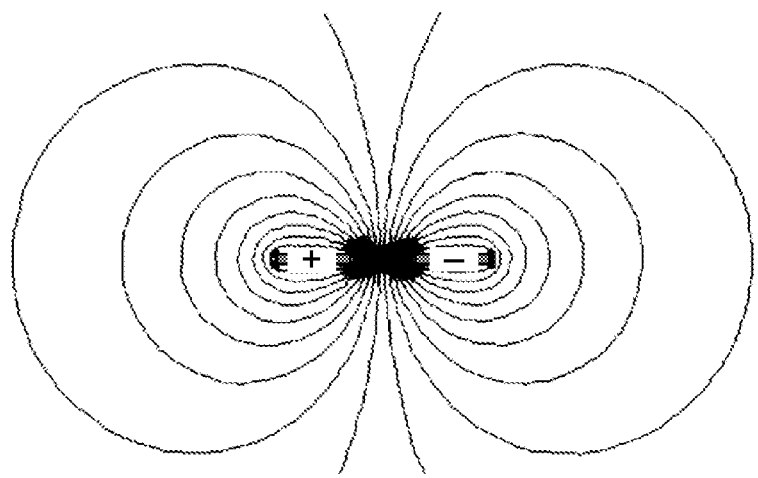
FIG. 1 illustrates the field strengths around differential signal trace pairs for high-speed data communication interfaces according to the prior art.
Figure 1:
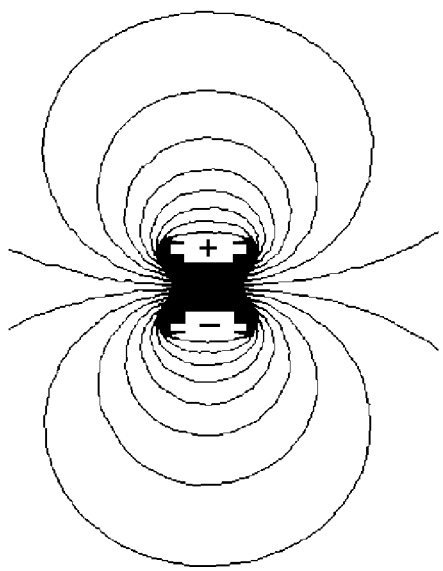
Figure 1:
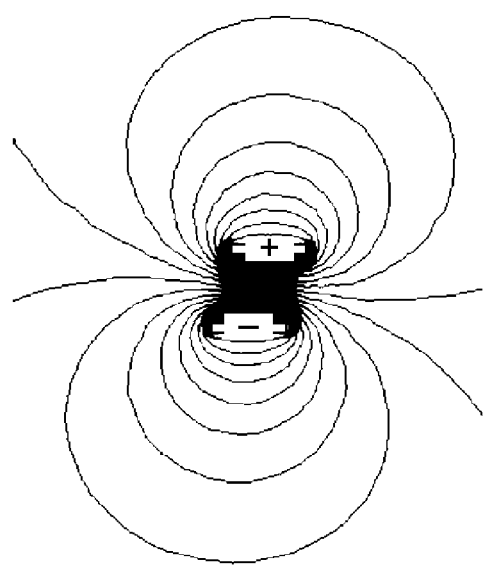

FIG. 1 illustrates the field strengths around differential signal trace pairs for high-speed data communication interfaces as are known in the art. Differential signal traces are typically implemented in a printed circuit board (PCB) as traces on the surface of the PCB or within one or more signal layer within the PCB. In a first case, differential signal traces are implemented within a common signal layer in a horizontal orientation and the traces are said to be edge coupled. The field coupling (electromagnetic field strength) of an edge coupled differential signal trace pair is illustrated in a top image 100 of FIG. 1. Here it can be seen that the edge coupled differential signal trace pair has weak coupling between the traces, and generates a large electromagnetic field around the trace pair. For these reasons, edge coupled differential signal trace pairs are more susceptible to crosstalk from other signals in the PCB, and sets of edge coupled differential signal trace pairs must be widely spaced within a particular layer of the PCB in order to improve the signal integrity of each of the trace pairs.

In another case, differential signal traces are implemented in two adjacent signal layers in a vertical orientation and the traces are said to be broadside coupled. The field coupling of a broadside coupled trace par is illustrated in a bottom-left image 110 of FIG. 1. Here it can be seen that the broadside coupled differential signal trace pair has stronger coupling between the traces, and generates a smaller electromagnetic field around the trace pair. However, as illustrated in the bottom-right image 115 of FIG. 1, any misalignment of the signal traces in a broadside coupled differential signal trace pair results in less coupling between the traces, and in a larger electromagnetic field around the trace pair. As such, even with broadside coupled differential signal trace pairs, the pair-to-pair isolation needs to be large to reduce the crosstalk between trace pairs due to any such misalignments. Additional signal integrity issues may be experienced with broadside coupled differential signal trace pairs due to tolerances in the insulating layer (prepreg) thicknesses.

Figure 2:
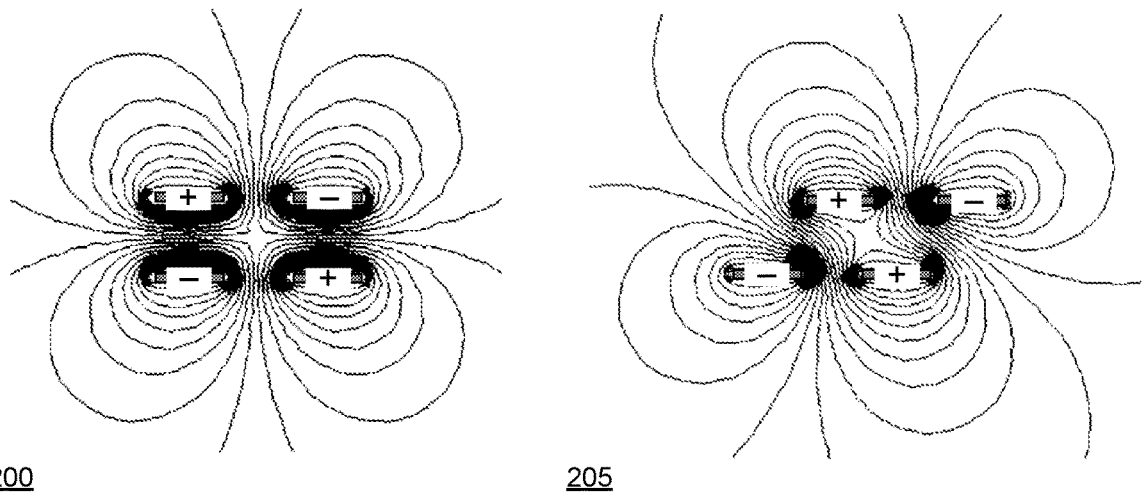
FIG. 2 illustrates the field strengths around a quad-trace pair for a high-speed data communication interfaces according to an embodiment of the current disclosure.
Figure 2:
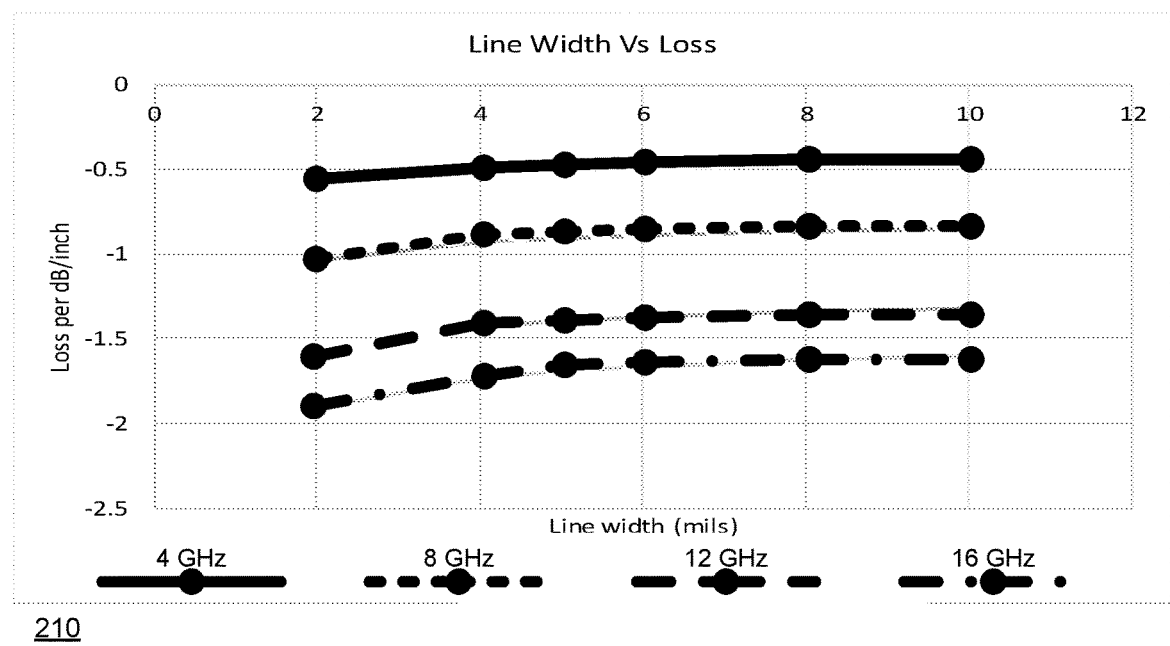

FIG. 2 illustrates the field strengths around quad-trace arrangement for high-speed data communication interfaces in accordance with the current embodiments. The quad-trace arrangement is a differential signal trace structure with four traces, including two traces on a first signal layer of the PCB and two additional traces on a second, adjacent layer of the PCB. Further, a positive leg and a negative leg of the differential signal is carried on each layer, with the positive leg of one layer placed over the negative leg of the other layer. As differential signal traces are commonly referred to as a trace pair, the term "quad-trace pair" shall be used hereinafter to refer to the quad-trace arrangement.

The field coupling of a quad-trace pair is illustrated in a top-left image 200 of FIG. 2. Here it can be seen that the quad-trace pair has strong coupling between the traces, and generates a small electromagnetic field around the arrangement. Moreover, as illustrated in the top-right image 205 of FIG. 2, any misalignment of the signal traces in a quad-trace pair remains tightly coupled and the electromagnetic field around the quad-trace pair remains small. As such, the quad-trace pairs necessitates less isolation between adjacent quad-trace pars to ensure adequate immunity to crosstalk between the quad-trace pairs, even with misalignments between the signal layers.

Advantages of the quad-trace pair includes the lower crosstalk as described above, and greater routing density of the differential signal pairs within the PCB. Moreover, as the number of traces (conductors) is doubled, the overall loss in the differential signal pair is reduced as well. This holds true even when using thinner traces, as can be seen by the graph 210 at the bottom of FIG. 2. The quad-trace pair geometry is also insensitive to stack up tolerances. In particular, the insulating layer thickness to a ground plane layer is not as critical because the quad-trace pair electromagnetic field is tightly coupled. Moreover, because edge coupling increases as broadside coupling faces, layer to layer tolerances are not as critical. Further, the quad-trace pair is not sensitive to crossing moats or secondary referencing to power planes. In sum, the quad-trace pair is a low-emission and low-susceptibility geometry. Examples of a high-speed data communication interface include a Small Form Factor Pluggable (SFP+) interface for network communications, a Serial-ATA interface, a DisplayPort interface, a PCIe interface, a proprietary high-speed data communication interface, or the like.

Figure 3:
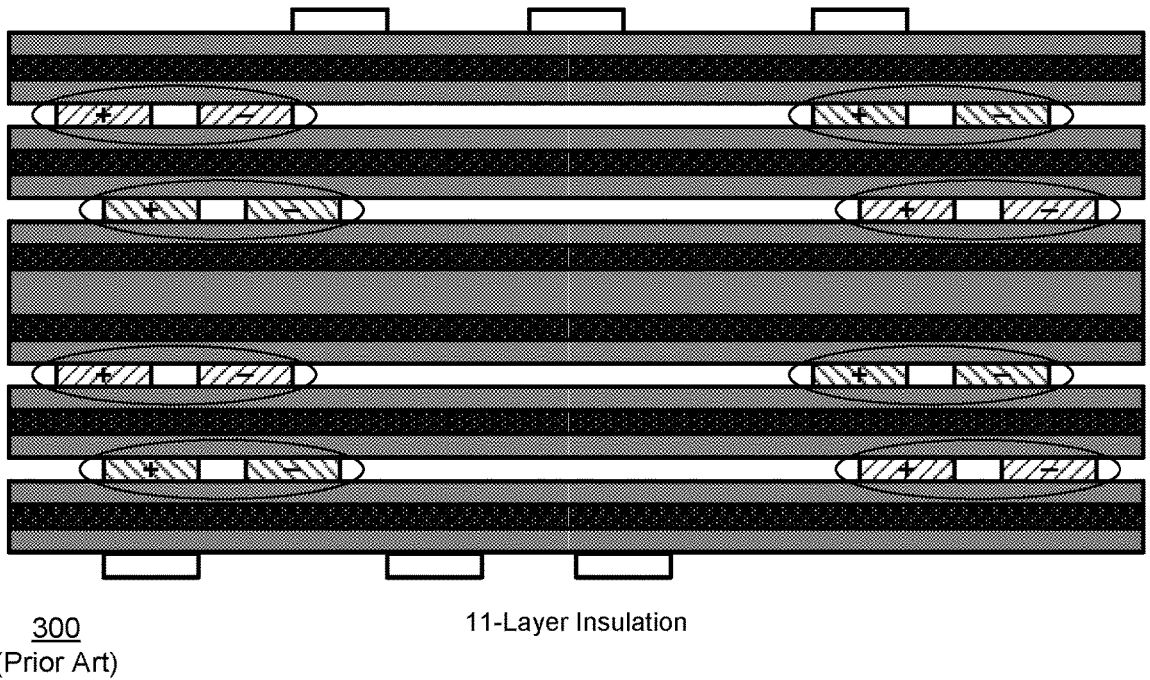
FIG. 3 illustrates printed circuit board stack ups for differential signal trace pairs and quad-trace pairs according to an embodiment of the current disclosure.
Figure 3:
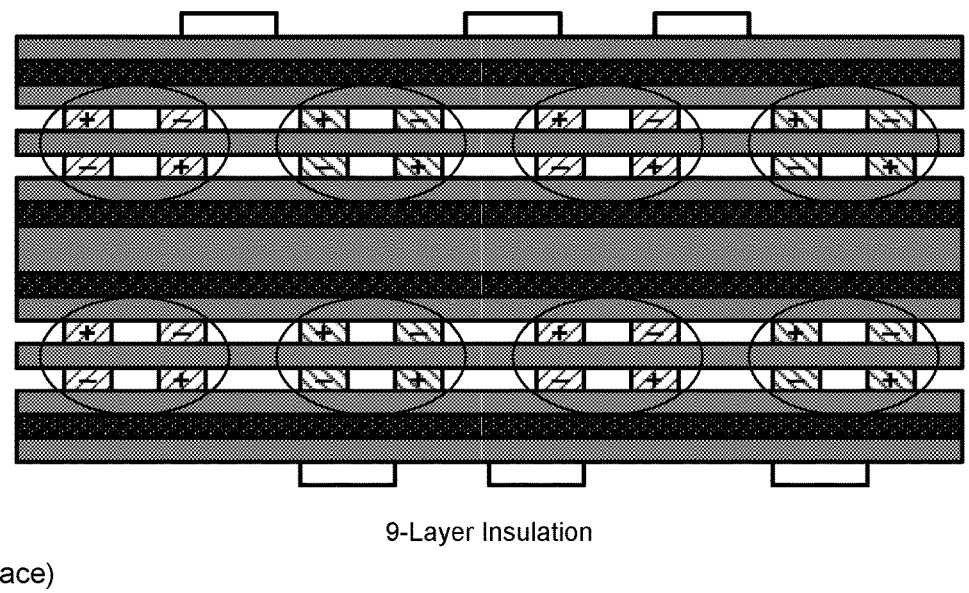

FIG. 3 illustrates PCB stack ups 300 and 310. A PCB will be understood to be fabricated as a multi-layer PCB with various circuit traces formed on the front and back surfaces of the add-in card PCB, with various signal layers, power layers, and ground layers, and the like. The various circuit traces and layers may be formed of gold, nickel, tin, tin-lead, or other materials, as needed or desired. The circuit trace layers, ground layers, and power layers are sandwiched between insulating layers of PCB material which may include prepregnated fiberglass, Duroid, FR4, epoxy resin, or the like, as needed or desired. The circuit trace layers, ground layers, and power layers may include copper layers, aluminum layers, iron layers, or the like, as needed or desired. The details of PCB manufacture and add-in card assembly are known in the art, and will not be further described herein, except as needed to illustrate the current embodiments.

PCB stack 300 illustrates routing eight edge-coupled differential signal pairs as may be typical in the prior art. Here, the eight edge-coupled differential signal pairs are highlighted and cross-hatched. The power and ground layers are illustrated as black layers, and the insulating layers (prepreg) are illustrated as lighter layers. Here, the rouging of eight edge-coupled differential signal pairs necessitates a wide spacing between the signal pairs, and utilizes 11 insulating (prepreg) layers and six power and ground layers. Additionally, a PCB stack 310 for routing eight quad-trace pairs is illustrated. Here, the eight quad-trace pairs are highlighted and cross-hatched. The power and ground layers are illustrated as black layers, and the insulating layers (prepreg) are illustrated as lighter layers. Here, the rouging of eight quad-trace pairs necessitates a narrower spacing between the signal pairs, resulting in a narrower profile for PCB stack 310 than for PCB stack 300. Additionally, PCB stack 310 utilizes only 9 insulating (prepreg) layers and four power and ground layers. Thus the use of quad-trace pair routing may result in space savings on a PCB (i.e., a smaller PCB), a denser routing on an existing size PCB, and a lower PCB layer count, resulting in manufacturing cost savings.

As such, add-in card PCB 100 may be fabricated as a multi-layer PCB with various circuit traces formed on the front and back surfaces of the add-in card PCB, with various signal layers, power layers, and ground layers, and the like. The various circuit traces and layers may be formed of gold, nickel, tin, tin-lead, or other materials, as needed or desired. The circuit trace layers, ground layers, and power layers are sandwiched between insulating layers of PCB material which may include prepregnated fiberglass, Duroid, FR4, epoxy resin, or the like, as needed or desired. The circuit trace layers, ground layers, and power layers may include copper layers, aluminum layers, iron layers, or the like, as needed or desired. The details of PCB manufacture and add-in card assembly are known in the art, and will not be further described herein, except as needed to illustrate the current embodiments.

Figure 4:
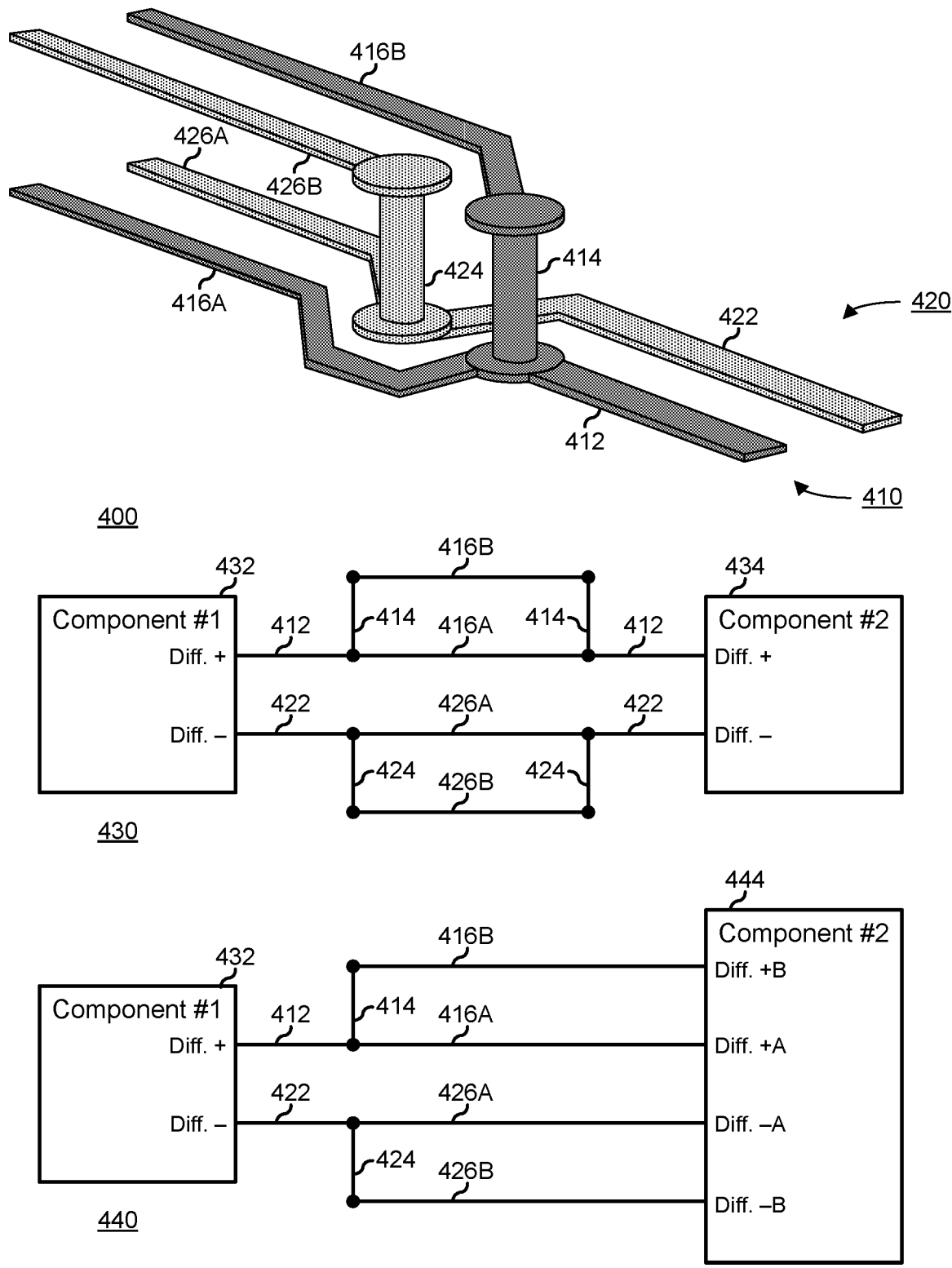
FIG. 4 illustrates a printed circuit board structure for a quad-trace pair according to an embodiment of the current disclosure.

FIG. 4 illustrates a portion of a PCB 400 for implementing a quad-trace pair geometry. A typical electronic integrated circuit that includes a differential signal high-speed data communication interface will include contacts for a standard trace pair, that is for two traces, a positive signal contact and a negative signal contact. In particular, the typical electronic integrated circuit does not include four contacts for a quad-trace pair. As such, where PCB 400 includes an integrated circuit (not illustrated) that includes a differential signal high-speed data communication interface, the PCB will include a positive trace 410 and a negative trace 421 that are connected to the contacts of the integrated circuit to receive the differential signal. Positive trace 410 includes a positive source trace 412 on a first signal layer of PCB 400, a positive via structure 414 that interconnects the first signal layer to a second signal layer, a first positive destination trace 416A connected to the positive via structure on the first signal layer, and a second positive destination trace 416B connected to the positive via structure on the second signal layer.

Similarly, negative trace 420 includes a negative source trace 412 on the first signal layer, a via negative structure 424 that interconnects the first signal layer to the second signal layer, a first negative destination trace 426A connected to the negative via structure on the first signal layer, and a second negative destination trace 416B connected to the negative via structure on the second signal layer. PCB 400 routes first positive destination trace 216A directly below second negative destination trace 226B, and routes first negative destination trace 226A directly below second positive destination trace 216B. Further, where a destination integrated circuit includes contacts only for a standard trace pair for the differential signal high-speed data communication interface, a similar structure may be needed to convert the quad-trace pair back into a standard trace pair, as needed or desired (see schematic 430). On the other hand, where a destination integrated circuit includes contacts for a quad-trace pair for the differential signal high-speed data communication interface, no additional structure may be needed (see schematic 440). It will be understood that source traces 412 and 422 may have different profiles than destination traces 416A, 416B, 426A, and 426B as needed or desired. For example, source traces 412 and 422 may be wider than destination traces 416A, 416B, 426A, and 426B for better impedance matching between the source traces and the destination traces.

Figure 5:
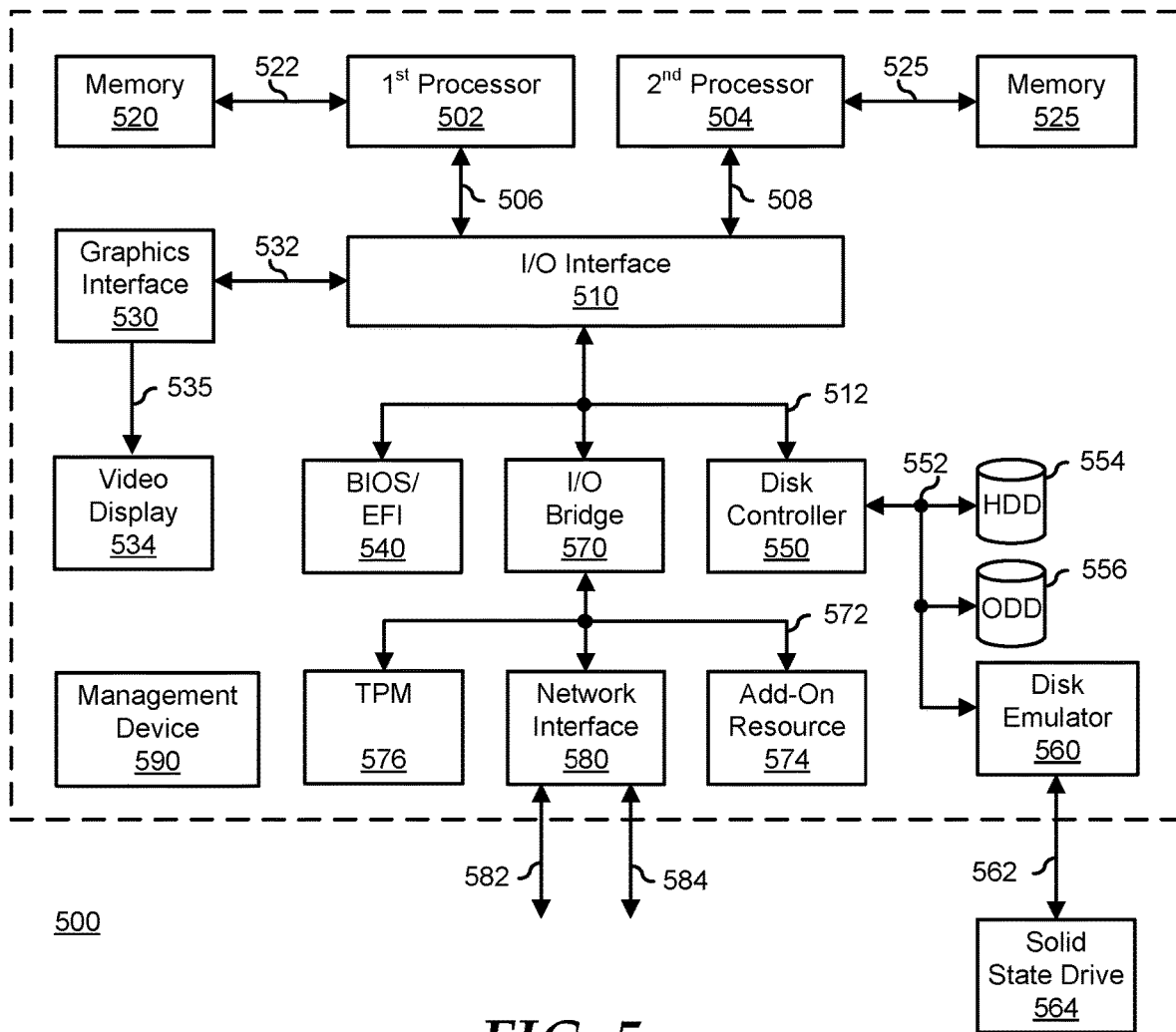
FIG. 5 is a block diagram illustrating a generalized information handling system according to another embodiment of the present disclosure.

FIG. 5 illustrates a generalized embodiment of an information handling system 500. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 500 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 500 can include processing resources for executing machine-executable code, such as a central processing unit (CPU), a programmable logic array (PLA), an embedded device such as a System-on-a-Chip (SoC), or other control logic hardware. Information handling system 500 can also include one or more computer-readable medium for storing machine-executable code, such as software or data. Additional components of information handling system 500 can include one or more storage devices that can store machine-executable code, one or more communications ports for communicating with external devices, and various input and output (I/O) devices, such as a keyboard, a mouse, and a video display. Information handling system 500 can also include one or more buses operable to transmit information between the various hardware components.

Information handling system 500 can include devices or modules that embody one or more of the devices or modules described below, and operates to perform one or more of the methods described below. Information handling system 500 includes a processors 502 and 504, an input/output (I/O) interface 510, memories 520 and 525, a graphics interface 530, a basic input and output system/universal extensible firmware interface (BIOS/UEFI) module 540, a disk controller 550, a hard disk drive (HDD) 554, an optical disk drive (ODD) 556, a disk emulator 560 connected to an external solid state drive (SSD) 562, an I/O bridge 570, one or more add-on resources 574, a trusted platform module (TPM) 576, a network interface 580, and a management device 590. Processors 502 and 504, I/O interface 510, memory 520, graphics interface 530, BIOS/UEFI module 540, disk controller 550, HDD 554, ODD 556, disk emulator 560, SSD 562, I/O bridge 570, add-on resources 574, TPM 576, and network interface 580 operate together to provide a host environment of information handling system 500 that operates to provide the data processing functionality of the information handling system. The host environment operates to execute machine-executable code, including platform BIOS/UEFI code, device firmware, operating system code, applications, programs, and the like, to perform the data processing tasks associated with information handling system 500.

In the host environment, processor 502 is connected to I/O interface 510 via processor interface 506, and processor 504 is connected to the I/O interface via processor interface 508. Memory 520 is connected to processor 502 via a memory interface 522. Memory 525 is connected to processor 504 via a memory interface 527. Graphics interface 530 is connected to I/O interface 510 via a graphics interface 532, and provides a video display output 535 to a video display 534. In a particular embodiment, information handling system 500 includes separate memories that are dedicated to each of processors 502 and 504 via separate memory interfaces. An example of memories 520 and 525 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 540, disk controller 550, and I/O bridge 570 are connected to I/O interface 510 via an I/O channel 512. An example of I/O channel 512 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 510 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 540 includes BIOS/UEFI code operable to detect resources within information handling system 500, to provide drivers for the resources, initialize the resources, and access the resources. BIOS/UEFI module 540 includes code that operates to detect resources within information handling system 500, to provide drivers for the resources, to initialize the resources, and to access the resources.

Disk controller 550 includes a disk interface 552 that connects the disk controller to HDD 554, to ODD 556, and to disk emulator 560. An example of disk interface 552 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 560 permits SSD 564 to be connected to information handling system 500 via an external interface 562. An example of external interface 562 includes a USB interface, an IEEE 1394 (Firewire) interface, a proprietary interface, or a combination thereof. Alternatively, solid-state drive 564 can be disposed within information handling system 500.

I/O bridge 570 includes a peripheral interface 572 that connects the I/O bridge to add-on resource 574, to TPM 576, and to network interface 580. Peripheral interface 572 can be the same type of interface as I/O channel 512, or can be a different type of interface. As such, I/O bridge 570 extends the capacity of I/O channel 512 when peripheral interface 572 and the I/O channel are of the same type, and the I/O bridge translates information from a format suitable to the I/O channel to a format suitable to the peripheral channel 572 when they are of a different type. Add-on resource 574 can include a data storage system, an additional graphics interface, a network interface card (NIC), a sound/video processing card, another add-on resource, or a combination thereof. Add-on resource 574 can be on a main circuit board, on separate circuit board or add-in card disposed within information handling system 500, a device that is external to the information handling system, or a combination thereof.

Network interface 580 represents a NIC disposed within information handling system 500, on a main circuit board of the information handling system, integrated onto another component such as I/O interface 510, in another suitable location, or a combination thereof. Network interface device 580 includes network channels 582 and 584 that provide interfaces to devices that are external to information handling system 500. In a particular embodiment, network channels 582 and 584 are of a different type than peripheral channel 572 and network interface 580 translates information from a format suitable to the peripheral channel to a format suitable to external devices. An example of network channels 582 and 584 includes InfiniBand channels, Fibre Channel channels, Gigabit Ethernet channels, proprietary channel architectures, or a combination thereof. Network channels 582 and 584 can be connected to external network resources (not illustrated). The network resource can include another information handling system, a data storage system, another network, a grid management system, another suitable resource, or a combination thereof.

Management device 590 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 500. In particular, management device 590 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 500, such as system cooling fans and power supplies. Management device 590 can include a network connection to an external management system, and the management device can communicate with the management system to report status information for information handling system 500, to receive BIOS/UEFI or system firmware updates, or to perform other task for managing and controlling the operation of information handling system 500. Management device 590 can operate off of a separate power plane from the components of the host environment so that the management device receives power to manage information handling system 500 when the information handling system is otherwise shut down. An example of management device 590 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 590 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A printed circuit board (PCB) for transmitting a differential signal between a first component and a second component, the PCB comprising:
   a first conductive signal layer including a first differential signal pair of the differential signal, the first differential signal pair including:
   a first positive trace configured to be coupled at a first end to a positive signal contact of the first component;
   a second positive trace configured to be coupled at a first end to a second end of the first positive trace and to be coupled at a second end to a first positive signal contact of the second component;
   a first negative trace configured to be coupled at a first end to a negative signal contact of the first component; and
   a second negative trace configured to be coupled at a first end to a second end of the first negative trace and to be coupled at a second end to a first negative signal contact of the second component, the second positive trace being adjacent to the second negative trace;
   a second conductive signal layer;
   a first positive via between the first conductive layer and the second conductive signal layer, the first positive via being coupled to the second end of the first positive trace and to the first end of the second positive trace; and
   a first negative via between the first conductive signal layer and the second conductive signal layer, the first negative via being coupled to the second end of the first negative trace and to the first end of the second negative trace;
   the second conductive signal layer including a second differential signal pair of the differential signal, the second differential signal pair including:
   a third positive trace coupled at a first end to the first positive via and configured to be coupled at a second end to a second positive signal contact of the second component; and
   a third negative trace coupled at a first end to the negative via and configured to be coupled at a second end to a second negative signal contact of the second component, the third positive trace being adjacent to the third negative trace.

2. The PCB of claim 1, further comprising:
   a second positive via between the first conductive signal layer and the second conductive signal layer, the second positive via being coupled to the second positive trace at a location between the first positive via and the second end of the second positive trace; and
   a second negative via between the first conductive signal layer and the second conductive signal layer, the second negative via being coupled to the second negative trace at a location between the first negative via and the second end of the second negative trace.

3. The PCB of claim 2, wherein:
   the second positive via is coupled to the second end of the third positive trace; and
   the second negative via is coupled to the second end of the third negative trace.

4. The PCB of claim 1, wherein the first and second conductive signal layers are adjacent conductive signal layers.

5. The PCB of claim 4, wherein the first and second conductive signal layers are separated by an insulating layer of the PCB.

6. The PCB of claim 5, wherein the insulting layer includes one of a prepregnated fiberglass layer, a Duroid layer, a FR4 layer, and an epoxy resin layer.

7. The PCB of claim 1, wherein the first, second, and third positive traces and the first, second, and third negative traces are formed of one of gold, nickel, tin, and tin-lead.

8. The PCB of claim 1, wherein;
the third positive trace is substantially directly below the second negative trace; and
the third negative trace is substantially directly below the second positive trace.

9. A method for transmitting a differential signal in a printed circuit board (PCB) between a first component and a second component, the method comprising:
forming a first conductive signal layer in the PCB;
forming a second conductive signal layer in the PCB;
forming a first differential signal pair of the differential signal in the first conductive signal layer, the first differential signal pair including:
a first positive trace configured to be coupled at a first end to a positive signal contact of the first component;
a second positive trace configured to be coupled at a first end to a second end of the first positive trace, and to be coupled at a second end to a first positive signal contact of the second component;
a first negative trace configured to be coupled at a first end to a negative signal contact of the first component; and
a second negative trace configured to be coupled at a first end to a second end of the first negative trace, and to be coupled at a second end to a first negative signal contact of the second component, the second positive trace being adjacent to the second negative trace;
forming a first positive via between the first conductive signal layer and the second conductive signal layer, the first positive via being coupled to the second end of the first positive trace and to the first end of the second positive trace;
forming a first negative via between the first conductive signal layer and the second conductive signal layer, the first negative via being coupled to the second end of the first negative trace and to the first end of the second negative trace; and
forming a second differential signal pair of the differential signal in the second conductive signal layer, the second differential signal pair including:
a third positive trace coupled at a first end to the first positive via and configured to be coupled at a second end to a second positive signal contact of the second component; and
a third negative trace coupled at a first end to the negative via and configured to be coupled at a second end to a second negative signal contact of the second component, the third positive trace being adjacent to the third negative trace.

10. The method of claim 9, further comprising:
forming a second positive via between the first conductive signal layer and the second conductive signal layer, the second positive via being coupled to the second positive trace at a location between the first positive via and the second end of the second positive trace; and
forming a second negative via between the first conductive signal layer and the second conductive signal layer, the second negative via being coupled to the second negative trace at a location between the first negative via and the second end of the second negative trace.

11. The method of claim 10, further comprising:
coupling the second positive via to the second end of the third positive trace; and
coupling the second negative via to the second end of the third negative trace.

12. The method of claim 9, wherein the first and second conductive signal layers are adjacent conductive signal layers.

13. The method of claim 12, wherein the first and second conductive signal layers are separated by an insulating layer of the PCB, and wherein the insulting layer includes one of a prepregnated fiberglass layer, a Duroid layer, a FR4 layer, and an epoxy resin layer.

14. The method of claim 9, wherein the first, second, and third positive traces and the first, second, and third negative traces are formed of one of gold, nickel, tin, and tin-lead.

15. The method of claim 9, wherein;
the third positive trace is substantially directly below the second negative trace; and
the third negative trace is substantially directly below the second positive trace.

16. An information handling system, comprising:
a first component;
a second component; and
a printed circuit board (PCB) for transmitting a differential signal between a first component and a second component, the PCB including:
a first conductive signal layer including a first differential signal pair of the differential signal, the first differential signal pair including:
a first positive trace configured to be coupled at a first end to a positive signal contact of the first component;
a second positive trace configured to be coupled at a first end to a second end of the first positive trace, and to be coupled at a second end to a first positive signal contact of the second component;
a first negative trace configured to be coupled at a first end to a negative signal contact of the first component; and
a second negative trace configured to be coupled at a first end to a second end of the first negative trace, and to be coupled at a second end to a first negative signal contact of the second component, the second positive trace being adjacent to the second negative trace; and
a second conductive signal layer;
a first positive via between the first conductive signal layer and the second conductive signal layer, the first positive via being coupled to the second end of the first positive trace and to the first end of the second positive trace; and
a first negative via between the first conductive signal layer and the second conductive signal layer, the first negative via being coupled to the second end of the first negative trace and to the first end of the second negative trace;
the second conductive signal layer including a second differential signal pair of the differential signal, the second differential signal pair including:
a third positive trace coupled at a first end to the first positive via and configured to be coupled at a second end to a second positive signal contact of the second component; and a third negative trace coupled at a first end to the negative via and configured to be coupled at a second end to a second negative signal contact of the second component, the third positive trace being adjacent to the third negative trace.

17. The information handling system of claim 16, wherein;
the third positive trace is substantially directly below the second negative trace; and
the third negative trace is substantially directly below the second positive trace.

* * * * *